Oct. 19, 1965 G. E. MOORE 3,212,162
FABRICATING SEMICONDUCTOR DEVICES
Original Filed Jan. 5, 1962 4 Sheets-Sheet 1

INVENTOR.
GORDON E. MOORE
BY Roger L. Borovoy
ATTORNEYS

INVENTOR.
GORDON E. MOORE
BY Roger L. Borovoy
ATTORNEYS

INVENTOR.
GORDON E. MOORE
BY [signature]
ATTORNEYS

INVENTOR.
GORDON E. MOORE

United States Patent Office 3,212,162

Patented Oct. 19, 1965

3,212,162

FABRICATING SEMICONDUCTOR DEVICES

Gordon E. Moore, Los Altos Hills, Calif., assignors to Fairchild Camera and Instrument Corporation, Syosset, N.Y., a corporation of Delaware Original application Jan. 5, 1962, Ser. No. 164,503, now Patent No. 3,184,657, dated May 18, 1965. Divided and this application Mar. 22, 1965, Ser. No. 441,702
5 Claims. (Cl. 29—25.3)

This application is a divisional application of U.S. patent application No. 164,503 filed January 5, 1962 now U.S. Patent No. 3,184,657. The invention relates to an improvement in the fabrication of semiconductor devices, and particularly to certain improvements in the structure and method of producing these devices which permit the fabrication of much smaller transistor geometries to attain considerably higher frequency response than has heretofore been possible.

The fabrication of any transistor presents problems of holding small dimensional tolerances and maintaining registration during the successive steps of building up the device. However, if transistors are to be produced having a surface area in the order of two to four square mils or less, and have an emitter area in the order of 0.25 square mil which is separated from the base contact by some 0.5 mil or less, special and unique procedures and structures must be utilized to produce an operable device to which external contacts can be attached. The minimum size to which transistors can be reduced is dependent to a great extent upon minimum possible tolerances, accuracy of registration of successive patterns used in building up the structure, and the minimum resolution which is possible in processes, such as photoengraving and plating, employed in fabricating the devices.

The conventional fabrication techniques previously used and the resulting structure were limited by the ability to hold the dimensional and registration tolerances required to produce exceptionally small transistors having a surface area of one to two square mils or less and an emitter region in the order of 0.25 square mil. Originally, it was necessary to utilize a transistor structure which had sufficiently large contact regions so that the external contacts be attached directly within the area of each region and not extend over the bounding P-N junction so as to short out the transistor. This requirement made it necessary for transistors to be of a size in which the individual base and emitter regions were sufficiently large so that external wires could be attached directly to each contact and not short out the junction separating the adjacent regions. Subsequent developments brought forth the concept of coating the surface of the semiconductor device, into which appropriate P and N regions had been diffused, with an insulating film. Holes were then cut through the film by etching or photoengraving to expose the respective P and N regions so that metal contacts could be plated over the surface into contact with their respective region but not short out the surrounding junction because of the insulating film on the surface. Such a method is described in the copending application Serial No. 830,507 of Robert N. Noyce, filed July 30, 1959, now U.S. Patent No. 2,981,877, and assigned to the same assignee as this invention. Although the concept of Noyce permits a considerable reduction in size, transistor geometries of the size of interest in this application are not readily achieved by that process, as the accumulation of errors induced by the relatively large number of successive steps in applying the necessary patterns to build up the transistor structure would exceed the tolerances permissible for very small transistor elements. In the prior art, a photoengraving pattern has to be aligned over the wafer for each of the steps of exposing a hole for diffusing a base area, cutting another hole for diffusing an emitter region, creating a pattern of complexly-shaped holes through the insulating film to expose the regions to which contacts are attached, and applying a plating pattern for the formation of the metal contacts. Errors accumulate every time a pattern is applied to build up another element or region of the transistor. The minimum tolerances which are practical in producing these closely nesting contacts militate against exceptionally small structures.

The applicant has solved the more critical problems relating to the manufacture of small transistors or devices having very closely spaced junctions by developing a method and a structure whereby the errors of registration and tolerances have a minimum effect on the end product. He has developed a method of building up the various elements in a transistor through a minimum number of steps involving the application of successive patterns in which registration is a source of errors. His method involves but two successive steps in which registration errors might be introduced. His novel method and structure permit the utilization of a single pattern for multiple purposes. The structure of the elements in his transistor are of such a shape that maximum errors in their location have a minimum effect on the final structure. It can be readily seen from the following disclosure that the simplified methods and the unusual geometry of the transistor structure permit the large scale manufacture of commercial transistors which are markedly smaller than have heretofore been possible and which have a very high frequency response, due to the very small dimensions of the P-N junctions. The invention, as disclosed below, thus makes it possible to mass produce exceedingly small transistors of 2–4 square mils or less, at reasonable cost.

Briefly the invention consists of a method of fabricating semiconductor devices which comprises the steps of oxidizing the surface of a semiconductor body to produce a substantially thick oxide film over the surface, said body containing impurities which will impart an N or a P-type conductivity, exposing a first island of unoxidized surface over said body by removing a portion of said film by photoengraving, forming a first region of different conductivity to that of said semiconductor body by diffusing into said island a first diffusant which will produce said different conductivity and to which said film is impervious and diffusing said diffusant into said body in a minimum oxidizing atmosphere so as to form a PN junction with said semiconductor body extending to the surface beneath said thick oxide layer and to regrow an oxide layer substantially thinner than the original film, and etching said surface lightly to remove only the thin oxide layer covering the first island and thereby expose said island.

The present invention is illustrated in the accompanying drawing wherein.

The invention is best understood and the structure delineated by describing the method of manufacturing the semiconductor device. Reference is made to FIGS. 1–6, considering the first configuration of the semiconductor device. A monocrystalline body of semiconductor 11, such as silicon, is utilized which contains a sufficient concentration of impurities to have initially a uniform conductivity type of either the N or P type. This body has, in the form of a wafer, a high-quality top surface 12 prepared in accordance with known transistor technology. The entire top surface 12 of the body is covered with an insulating film 13, which can be an oxide of the semi-conductor formed by exposing the surface to an oxidizing atmosphere at elevated temperatures, or by utilizing an oxidizing agent such as hydrogen peroxide, or other well-known oxidizing methods. It is to be understood the structures illustrated in the figures represent small segments of the wafer from which individual transistors are formed and that the wafer contains a large plurality of the structures each similar to those illustrated, the wafer being cut into segments to form the individual transistors herein illustrated as a last step.

Figure 1:
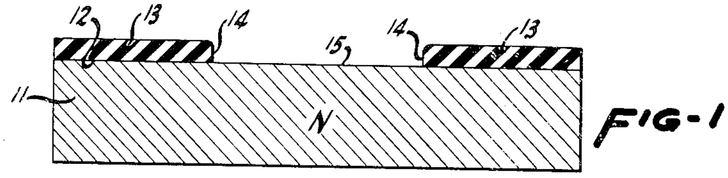
FIGS. 1 to 4 represent schematic cross-sections to an exaggerated scale of one configuration of a semiconductor device as it would appear at various steps in the manufacturing process.

Specifically referring to FIG. 1, a large number of holes 14, roughly equal to the number of transistors to be made from the wafer, are formed in the oxide film 13 to expose the surface of the wafer in area 15. This is best accomplished by a photoengraving process in which the very small holes can be accurately located over the surface of the wafer. The small areas 15 are accurately located by aligning the photoengraving pattern over the wafer.

Figure 2:
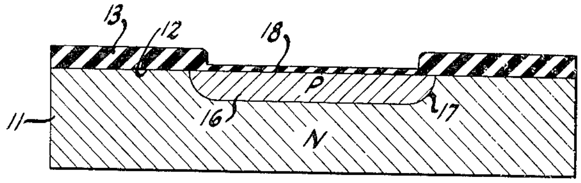

Referring specifically to FIG. 2, a diffusant containing impurities of the opposite conductivity type to that of semiconductor 11, of a concentration greater than the bulk impurities of wafer 11 and to which film 13 is impervious, is deposited on the wafer to contact the wafer surface in the exposed hole area 15. A base region of opposite conductivity to that of the semiconductor is formed in the layer 16 by the well-known diffusing method of exposing the wafer to an elevated temperature. For purposes of this illustration, it will be assumed that the semiconductor wafer 11 is N-type, therefore base region 16 would be a P-type. During the diffusion process a bowl-like P-N junction is formed along 17 which extends to the surface and completely bounds the base region 16. During the diffusion process, which is carried on in an oxidizing atmosphere, an oxide layer 18 is regrown into the hole 14. In the small-size transistor being produced by this process, the surface area of this base region 16 can well be as small as 2 to 4 square mils, or less.

Figure 3:
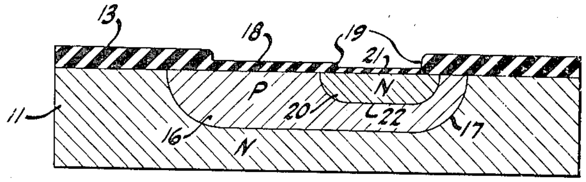

Next, referring to FIG. 3, a second hole 19, which is substantially smaller than the first hole 14 and entirely contained within its perimeter, is cut through the thin oxide film 18, which has regrown over the hole 14 during the base region diffusion process, to expose a portion of the surface of the newly formed base region. The conventional photoengraving process is the preferred method and this involves another pattern and moderately accurate alignment of the pattern with respect to the first hole. However, the location of the second hole 19 within the confines of the first hole 14 is not too critical. The second hole 19 should be substantially smaller than the first, in the order of approximately one-fourth the area or less. It should be eccentrically located within the first hole so that there is an area on the opposite side of the base region from this eccentric second hole on which a pattern roughly symmetrical and equal in area to the second hole 19 can be defined on the base region, however, its location within the rough requirement need not be exact. The size of this second hole 19 can be about the minimum size which can be formed by photoengraving, and holes about 0.5 mil in linear dimension are practical. Considerable leeway in registration error is permissible in locating this second pattern when the second hole is 0.25 to 0.50 square mil and is located within the confines of a first hole which is two to four square mils in area.

A diffusant having impurities of the opposite type to base region 16, in this case N-type, of a concentration greater than the impurities of the base region 16 and to which the oxide film is impervious, is applied into the hole 19. An emitter region 20 is then grown under the hole 19 by diffusion. The diffusion is carried out in a minimum oxidizing atmosphere so as to regrow a minimum oxide layer 21 over the emitter region in the hole 19. A P-N junction 22 separates the base regioin 16 and the emitter region 20 and extends to the surface where it completely bounds the emitter region 20. The second hole 19 is substantially offset from the center of the confining hole 14 so that the junctions 17 and 22 are markedly closer in one sector of the base region 16, as illustrated in FIG. 3. For the configuration of this invention, the surface area of the emitter region can be as small as 0.25 square mil.

Figure 4:
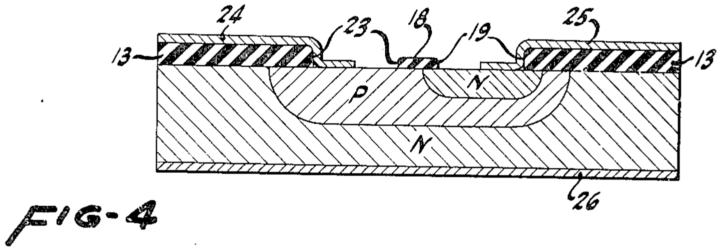
Figure 6:
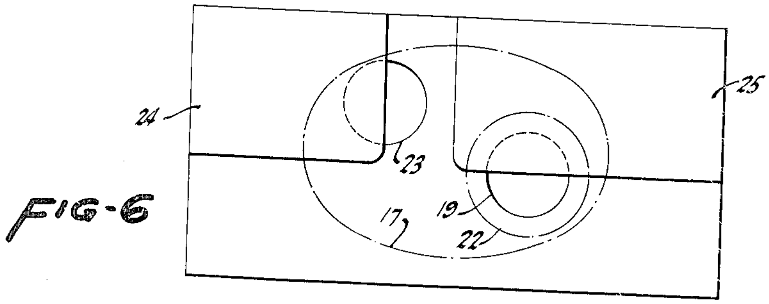

Referring now to FIG. 4, a third hole 23 is cut through the oxide layer, again within the confines of the first hole 14 but not touching the second hole 19. This third hole 23 should be approximately the same size as the second hole 19 and eccentrically located within the confines of the original hole 14 on the opposite side from that of the second hole 19, thus exposing a portion of the base region. Photoengraving utilizing a pattern properly aligned over the wafer, is the preferred method. However, as in the preceding step of forming the second hole, the location of this third hole is again not too critical. It should occupy an approximate correlative position in the hole 14 with respect to the second hole 19. Its position within the base region is not critical except that it must not overlap the junctions bounding the region. As can be seen in FIG. 6, and considering the manner in which the contacts are applied as described below, there is considerable leeway in locating these second and third holes within the confines of the first hole so that registration tolerance in locating the patterns is fairly liberal.

The minimum oxide layer 21, which was regrown over the emitter region in the area of the second hole 19, is removed, preferably by light etching with a weak solution, so that the emitter region 20 is exposed but the relatively thick original oxide films 13 and 18 are not removed. This then leaves the wafer covered by the oxide films 13 and 18 except for two small holes, 19 and 23, which expose the emitter region and the base region respectively.

Figure 5:
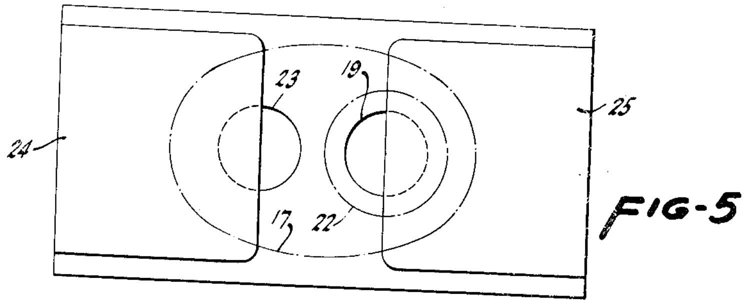
FIGS. 5 and 6 represent a plan view in exaggerated scale of the first configuration of FIGS. 1–4.

The base contact 24 and the emitter contact 25 are now plated onto the outside of the wafer to overlie the oxide layer 13 and extend into contact with the base and emitter regions in the hole areas 23 and 19, respectively, as illustrated in FIGS. 4 and 5. If a technique of applying the contact areas is employed wherein the two contacts are always applied in a fixed relationship and separation with respect to one another, their location can be made to be relatively non-critical. Such techniques include metal evaporation with the shadowing by a mask used to delineate the area whereupon no metal is to be deposited or the photoengraving process outlined in copending application of Moore and Noyce, Serial No. 823,838, now Patent No. 3,108,359, entitled "Method for Fabricating Transistors." The contacts may be substantially wider than the holes in the oxide film over the base and emitter regions and preferably at least as wide as the base region. By making these contact strips relatively wide, a considerable amount of sidewise error is permissible in locating them on the wafer. By avoiding any reverse curvature or other complicated shapes in their facing edges, there can be a maximum amount of leeway in their lengthwise placing on the wafer. These strips need only be located with sufficient accuracy so that each strip extends into some portion of the hole exposed over its respective P or N region so that it forms an ohmic electrical contact with its respective region and overlies insulating film at all other points. The plating process can be of the nature described in the co-pending application of Moore and Noyce, Serial No. 823,838, entitled "Method for Fabricating Transistors," or any other equivalent process which will produce an ohmic electrical contact between each strip and the respective exposed areas of the regions within the holes 19 and 23.

FIG. 6 illustrates the relative non-criticality of the location of the holes exposing the emitter and base regions and the location of the contact strips on the wafer. The two holes 19 and 23 are located substantially unsymmetrical with relation to the base region as defined by the junction 17 and the contact strips 24 and 25 are located substantially out of perfect alignment. However, as can be seen from FIG. 6, if the two holes are located approximately within opposite halves of the base region and if the contact strips are each located approximately within each half of the base region, a good transistor will result. Thus, the applicant has a structure in which considerable leeway is permissible in the location of the emitter and base region contact points and in placing the contact strips onto the device. Therefore reasonable registration errors can be tolerated when aligning the patterns used to cut the holes in the oxide film and in plating the contact strips onto the wafer. The effect of the described structure in producing a minimum size transistor in obvious from the simple mathematical analysis below:

*a*—the minimum dimension of a hole which can be formed by photoengraving.
*b*—the maximum error encountered in aligning the photo pattern (registration error).
*c*—the resolution with which two adjacent metal contacts can be deposited.

*Minimum length of device if maximum errors are to be tolerated*

(1) If $c \leqslant 2(a-b)$, length$=2a+4b$
(2) If $c \geqslant b$, length$=6b+c$

*Minimum width if maximum errors are to be tolerated*

Width$=a+2b$

The above sizes can be made with essentially no shrinkage, accepting maximum errors in each operation individually. When one considers that the errors associated with the alignment of successive patterns are individually subject to statistical distribution about a mean, the small probability of making errors in the worst combinations allows one to make structures at practical yields where size is considerably below the one designed to accept all registration errors.

Assume *a* is approximately 0.5 mil
Assume *b* is approximately 0.25 mil
Assume *c* is approximately 0.5 mil With these assumptions, it can be seen that a structure which is 1 by 2 mils in size can be produced by this described method. This is considerably smaller than transistors have heretofore been fabricated in large scale production. The small transistor is possible because of the simplified methods and structure which have reduced the effects of registration and dimensional tolerances. Using this structure silicon transistors have been constructed wherein the emitter region is a strip 0.5 mil by 2 mils with base contact separated by 0.5 mil from the emitter and running parallel along the long dimension. While these units did not represent the ultimate size that can be made in this manner, they exhibited superior high frequency performance over any silicon transistors previously known. Oscillations were obtained using these transistors in conventional circuits at frequencies well in excess of 1000 megacycles.

As the last step in the process when producing the transistor illustrated in FIG. 4, a collector contact strip 26 can be plated onto the lower side of the wafer. Although this discussion has primarily been concerned with the fabrication of a very small transistor, it is readily apparent that an extremely small diode can likewise be produced.

A further refinement of the above discussed structure and process for manufacturing another configuration for exceptionally small semiconductor device geometries will be described below with reference to FIGS. 7 to 13. The above described process is even further simplified to reduce by one the steps wherein the registration of successive patterns will effect the size of the transistor. Thus the second configuration will produce an even smaller transistor than will the first.

Figure 7:
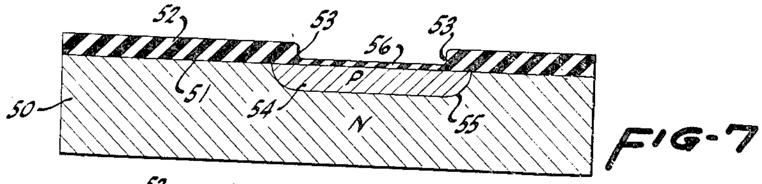
FIGS. 7, 8, 10, 11 and 12 represent schematic cross-sections to an exaggerated scale of a second configuration of the device as it would appear at various stages in the manufacturing process.

Referring specifically to FIG. 7, a wafer of extrinsic semiconductor material 50, which contains sufficient impurities so that its bulk is of one conductivity, has a high quality surface 51 on which an oxide layer 52 is formed as described in the preceding configuration. Again for the purpose of illustration, it is assumed that the wafer has the type of impurities which will produce an N-type conductivity. A first hole 53 is cut through the oxide layer by conventional photoengraving processes to expose the surface of the wafer under the hole. A diffusant, having impurities of the opposite type to that of the wafer and to which the oxide film is impervious, is applied to the wafer surface in the area of hole 53. A base region 54 of opposite conductivity to the wafer is then formed as an island in the surrounding wafer bulk material by a conventional diffusing process carried out in a minimum oxidizing atmosphere so that an oxide film 56 of minimum thickness is regrown in the hole area 53. The P-type base region 54 is separated from the bulk region 50 by the P-N junction 55 which extends to the surface and completely bounds the base region.

Figure 8:
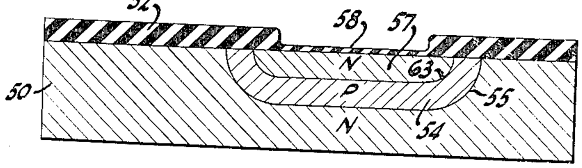

Now referring to FIG. 8, the oxide layer is etched lightly with a suitable acid to remove only the minimum oxide layer 56 formed in the hole 53 by the preceding diffusion process, thereby again exposing the surface of the wafer in the hole area 53. A suitable diffusant, having impurities of the opposite type to that of base region 54 and to which the oxide film is impervious, is applied to the surface within hole 53. An emitter region 57 (N-type conductivity) is then grown within and surrounded by the base region 54, again by a conventional diffusing process carried out in an oxidizing atmosphere, another thin oxide film 58 being formed on the surface within the hole 53. The P-N junction 63 separates the emitter region from the surrounding base region and extends to the surface where it bounds the emitter region. Thus, two regions of opposite conductivity, one contained within the other, are formed in successive steps by utilizing the same hole in the oxide film and talking advantage of lateral diffusion under the oxide layer, the two junctions 55 and 63 being completely separate, even though formed by diffusion through the same hole, by the somewhat greater diffusion distance, both downwardly and laterally, of the P-type impurities in layer 54 relative to the N-type impurities in layer 57.

Figure 9:
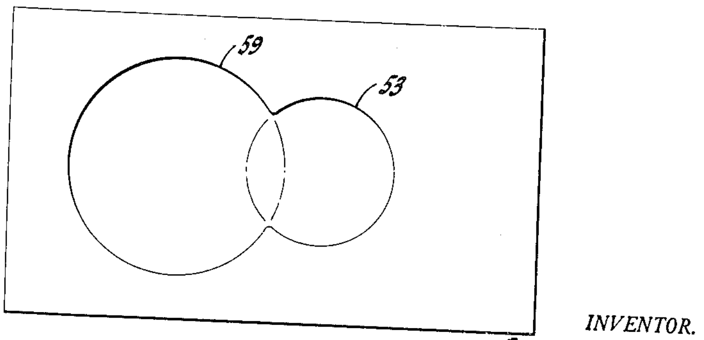
FIG. 9 is a partial plan view indicating one step in the process of producing the second configuration.

Referring now to FIG. 9, a second hole 59, which overlaps the first hole 53 and is at least substantially equal in size, is cut through the oxide layer so as to expose the surface of the wafer within the area of this second hole. The hole is best established by a photoengraving process. The location of this second hole 59 with respect to the first hole 53 is not critical. The objective is to expose an area which is at least roughly equal in size to the first hole and which touches or overlaps the first hole. The degree of overlapping is not particularly important, the basic criterion is to have a non-overlapping area in the second hole 59 which is at least closely equal to or greater than the area of the first hole 53. By making the second hole some 25% to 50% greater in the area than the first hole, considerable leeway is possible in its location. Thus a moderately larger registration error is permissible when applying the pattern to form this second hole, than is the case in the process according to FIGS. 1–4.

Figure 10:
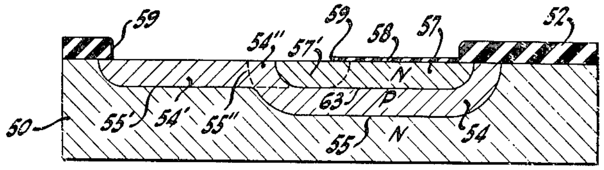
Figure 11:
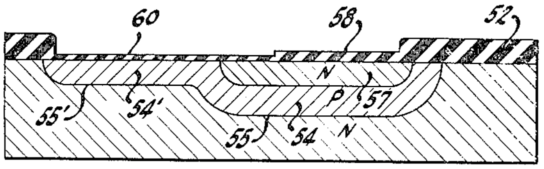
Figure 12:
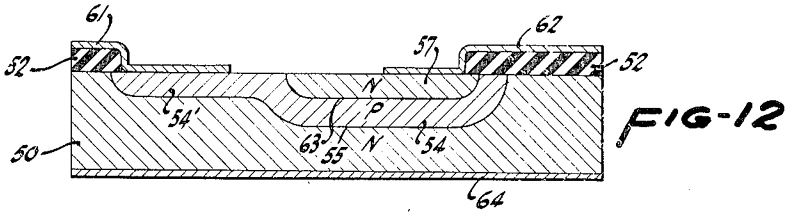
Figure 13:
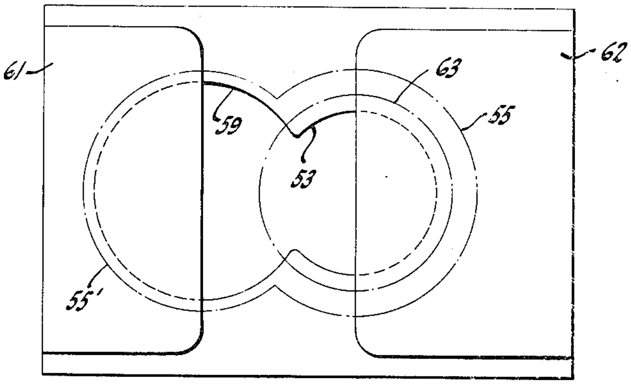
FIG. 13 is a plan view in exaggerated scale of the second configuration.

Next, and referring to FIG. 10, a diffusant, having the same type impurities as the base region (P-type) and to which the oxide film is impervious, is applied onto the surface in the area of the second hole 59. However, the concentration of P-type impurities in this diffusant is less than the concentration of N-type impurities in the emitter region 57, but the concentration is greater than the N-type impurities to be found in the bulk of the wafer 50. Purely for purposes of illustration, assume that the concentration of N-type impurities in the bulk 50 of the wafer is $10^{15}$ atoms/cc. and the concentration of N-type impurities in emitter region 57 is $10^{19}$ atoms/cc. On this basis, the diffusant should have a concentration of P impurities somewhere between $10^{15}$ and $10^{19}$/cc.

The diffusant is then diffused into the wafer in a minimum oxidizing atmosphere and another thin oxide layer 60 is regrown over the second hole area 59. Since the diffusant has a greater concentration of impurities than the bulk of the N-type wafer, any region of the wafer receiving this diffusant will be converted into a P-type conductivity as there is a surplus of holes in the diffusant over the free electrons in the bulk of the wafer. However, the concentration of the diffusant is not sufficient to convert any of the N-type emitter region 57 which is exposed to the diffusant, since there is a surplus of free electrons in the emitter region over available holes contained in the diffusant. The conductivity type of the P-type base region 54 is of course not altered by the diffusant since both are P-type. Referring to FIG. 10, it can be seen by the above analysis that the portion of the wafer bulk which is exposed to the diffusant, and designated as 54′, will be converted to P-type conductivity. That portion of the wafer under the second hole, which was a part of the P-type base region 54 and is exposed to the diffusant, will remain P-type, being designated as 54″. That portion of the emitter region which is exposed to the diffusant by reason of being within the overlapping hole 59, and which is designated as 57′ in FIG. 10, will remain an N-type conductivity. The P-N junction 63 around the emitter region therefore remains intact. In effect, what has been accomplished by this last diffusion process, is to make a lateral shelf like extension to the base region 54, this extension being labeled 54′ in FIG. 11. Of course that portion of the outer P-N junction 55 which was subjected to the diffusant and indicated in dotted line 55″ was wiped out and the outer P-N junction 55, which separates the base region 54 from the bulk 50, is extended to encompass the newly enlarged base region 54′, as is indicated by 55′. The entire P-N junction which separates the elongated base region from the bulk of the wafer 55 and 55′ is covered by the original oxide layer 52. This process has thus produced an inner emitter region 57 which is contained within an outer base region, 54 and 54′, the outer base region having a dipper shaped cross section with the emitter region contained within the bowl of the dipper.

The thin oxide film which has regrown over the areas of the overlapping holes 53 and 59 is then removed to expose surfaces of the emitter and the base regions for the attachment of contact strips. The emitter and base regions can be most easily exposed by lightly etching the surface of the wafer with a weak acid which will remove the relatively thin oxide films 58 and 60 which cover the holes but will not entirely remove the relatively thick original oxide film 52 which remains. This is the process which produces the best results when manufacturing minimum size devices as it does not involve a separate photoengraving step with the attendant registration errors. However, the oxide could be removed from separate areas over the emitter and base regions by a photograving step.

Two contact strips 61 and 62 are plated onto the wafer in the same manner as was described in the first configuration. These strips, likewise, are relatively wide with substantially parallel facing edges so as to permit considerable leeway with respect to their location on the wafer. These strips are plated so as to be substantially parallel to the length of the elongated base region and separately extend inwardly onto the exposed emitter or the base region, respectively, from opposite directions. Thus there is considerable margin for error in lengthwise location, each contact strip having to contact just one portion of its respective regions. A lengthwise tolerance equal to about the diameter of the first small hole 53 is available for locating the contact strips. A lateral tolerance of about the same amount is available in sidewise placement of the strips. A collector contact strip 64 is plated onto the under surface of the wafer.

In this second configuration there are just two holes which must be cut in the insulating film by photoengraving and their relationship is such that considerable tolerance is permissible in locating one relative to the other. No additional holes have to be cut in the film for exposing contact areas as the two original holes can be utilized by regrowing minimum oxide layers in the diffusion process and removing the thin oxide layers through lightly etching the surface sufficiently to remove the thin oxide layers only, but leave the original insulating film intact. Thus, there is but one photoengraving step in which registration errors can accumulate. Due to the shape and size of the contact strips, the critical tolerances are no greater than in the plating process for the first configuration, as explained above. Therefore, semiconductor devices of substantially smaller size than the two square mil devices possible in the first configuration can be made when utilizing the second configuration.

In all of the above processess, the conductivity regions which are added to the original material are grown by applying a diffusant to holes which are cut through an insulating film, which acts as a mask in the diffusant process. In the diffusion process which follows, an important element is the lateral diffusion of impurities which progresses outwardly from the perimeter of the holes underneath the insulating film. By taking advantage of this lateral diffusion, several nesting regions of different conductivity can be successively grown with a very high degree of registration accuracy and the P-N junction which bounds the newly formed regions is covered by the insulating film where this junction reaches the surface of the wafer. This offers two advantages for making very small transistors. First, as described in the above material, several different conductivity regions can be located and grown by utilizing one point of reference; i.e., one hole cut in the impervious film overlying the semiconductor wafer is the basic source for establishing the critical dimensional relationship between the nesting emitter and base regions. Secondly, a much greater tolerance relative to the size of the conductivity regions is permissible in locating the contacts as the P-N junctions are covered with an insulating film in the critical areas. Therefore considerable relative leeway is permissible when plating the contacts into place and considerable error relative to the size of the emitter area can be tolerated and not short out the device.

The above description has specifically referred to an NPN type transistor. Obviously a PNP type transistor can be produced. Further, the structure can be expanded to have a larger number of nesting regions grown throughout the same and overlapping holes in the oxide film. By locating a second overlapping hole on the opposite side relative to the first overlapping hole, as described in the second configuration, another region can be added to produce an NPNP device similar to the second configuration but having another ledge on the opposite side to that of the base region in the second configuration.

While in the discussion above, particular emphasis has been placed upon making devices of minimum size, it is obvious that this structure can also be made in larger sizes to advantage. In particular, it is useful to increase the width of the device resulting in long, narrow emitter and base regions with substantially parallel contacts. In this manner the current and power handling ability of the device can be increased with no deleterious effect upon the high frequency characteristics. Alternatively a plurality of stripes can be employed with several separate emitter stripes and base stripes alternating with metal contacts from the plurality of emitter stripes brought out to a common metal area on the oxide layer on one side of the structure and therefrom the base stripes brought out to the other side to a similar common metal area.

Figure 14:
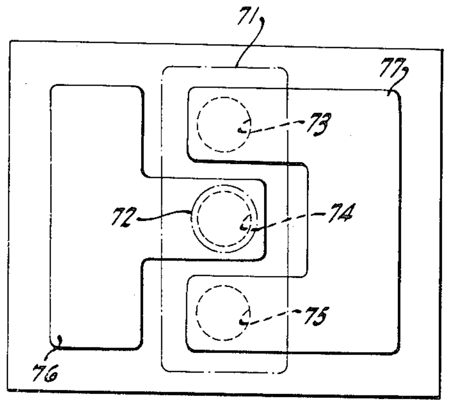
FIG. 14 is a plan view of a multicontact transistor configuration.

Referring to FIGURE 14, there will be seen to be shown a plan view of a transistor having an elongated base zone 71 such as may be formed, for example, in the manner described immediately above. Adjacent the center of this base zone there is disposed an emitter dot 72 and an oxide coating overlays the entire top of the wafer. Openings are formed through the insulating layer atop the wafer, as indicated for example, at 73, 74, and 75 to thereby expose the emitter and base for the attachment of electrical contacts thereto. With the transistor itself formed in accordance with the method described above in relation to FIGURES 10 to 13, the openings through the protective coating may overlap to attain the advantages previously noted. Over the top of the insulating coating and in adherent relation thereto, there is plated an electrical contact 76 extending through the opening 74 into ohmic contact with the emitter 72 and having an enlarged portion, as indicated, atop the insulating coating at one side of the wafer for ready attachment of an electrical lead to this contact. An electrical contact 77 is plated onto the top of the insulating coating of the wafer generally in the shape of the U turned on its side so that the legs thereof overlie at least a portion of the openings 73 and 75 to the base of the transistor. This second contact 77 will thus be seen to also provide an enlarged contact area at one side of the transistor wafer for ready attachment of an electrical lead thereto.

Figure 15:
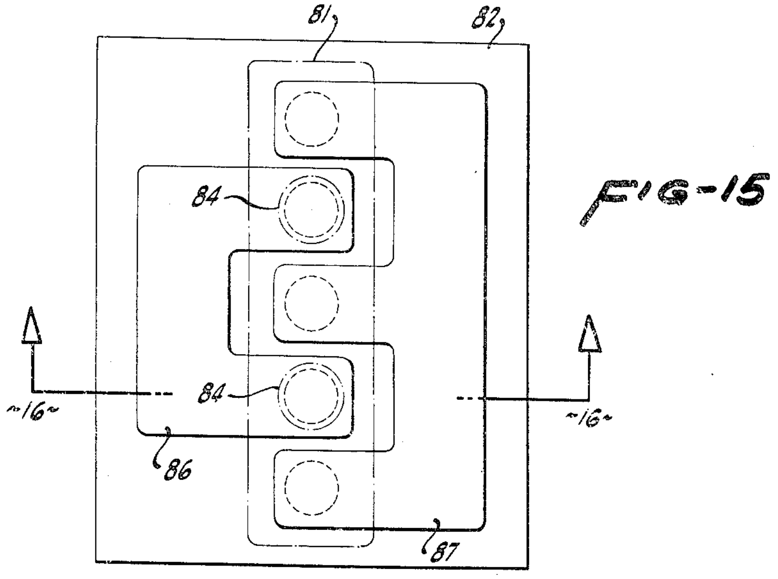
FIG. 15 is a plan view of a multiple emitter device with a multicontact configuration.
Figure 16:
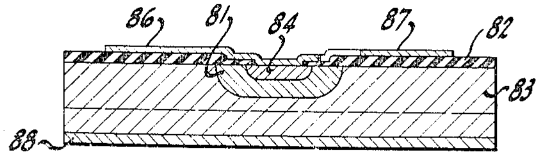
FIG. 16 is a sectional view taken in the plane 16—16 of FIG. 15.

Applicability of the present invention to a multielement device is illustrated in FIGURES 15 and 16, wherein a transistor of somewhat larger size is shown as having a relatively elongated base zone 81 diffused through an opening in an insulating protective coating 82 adhering to the upper surface of the semiconducting wafer 83. The wafer itself may, for example, be formed of an N+ conductivity type substrate with an epitaxially grown N-type layer above same. The junction of these two portions of the wafer are indicated by the horizontal dashed line through the wafer in FIGURE 16. A plurality of emitters 84 are diffused into the base 81, for example in the manner described above, and there are formed opening through the insulating layer 82 to expose the emitters 84 and at least portions of the base 81. With two emitters being provided in the individual transistor, as illustrated, there is then formed an electrical contact to the emitters by the plating of a metal onto the upper surface of the insulating material on the wafer to thereby form a generally U-shaped electrical contact 86 having a substantial area at one side of the wafer for ready connection of an electrical wire thereto. Ohmic contact to the base of the transistor may be formed by somewhat of a comb-shaped contact 87 produced by the plating of metal onto the upper surface of the insulating layer 82 with projecting legs overlying openings in the insulating layer to thereby ohmically contact a substantial area of the base beneath the layer and closely spaced from the emitter contacts. This comb-shaped base contact 87 interlocks with the U-shaped emitter contact 86 and also provides a substantial contact area at one side of the transistor atop same for the ready attachment of an electrical lead thereto. A collector electrode 88 may be plated on the under surface of the water if desired, or alternatively openings may be provided in the upper insulating layer 82 so that electrical contacts to the collector may also be made from the top planar surface of the wafer.

The structure illustrated in FIGURES 15 and 16 may have sufficient size so as to exhibit a substantial current and power handling ability and yet to exhibit very good high frequency characteristics because of the close spacing of transistor zones. The attainment of very close or small spacings between rectifying junctions of semiconducting devices and minimization of zone sizes therein provide for the attainment of the desired high frequency characteristics, and thus the invention is equally applicable to extremely minute transistors and diodes as well as to semiconducting devices of larger size, wherein these rectifying junctions are yet maintained in extremely close proximity.

Obviously many modifications and variations of the present invention are possible in light of the above teachings. Therefore, it is to be understood that, within the scope of the appended claims, the invention can be practiced in other ways than as specifically described in the detailed embodiments outlined in the above descriptive matter and drawings.

What is claimed is:

1. A method of fabricating semiconductor devices which comprises the steps of oxidizing the surface of a semiconductor body to produce a substantially thick oxide film over the surface, said body containing impurities which will impart an N or a P-type conductivity, exposing a first island of unoxidized surface over said body by removing a portion of said film by photoengraving, forming a first region of different conductivity to that of said semiconductor body by diffusing into said island a first diffusant which will produce said different conductivity and to which said film is impervious and diffusing said diffusant into said body in a minimum oxidizing atmosphere so as to form a PN junction with said semiconductor body extending to the surface beneath said thick oxide layer and to regrow an oxide layer substantially thinner than the original film, and etching said surface lightly to remove only the thin oxide layer covering the first island and thereby expose said island.

2. The method of claim 1 further defined by additional step of diffusing an impurity of the same conductivity type as said semiconductor body through the opening formed by the removal of said thin oxide film to form a region within said island of the same conductivity type as said semiconductor body with a PN junction between said region and said island extending to the surface of said body beneath said thick oxide film.

3. The method of claim 1 further defined by the additional step of forming an ohmic contact to said island by depositing a metal over said oxide film and in contact with the surface of said island through the opening formed by the removal of the thin oxide.

4. A method of fabricating semiconductor devices which comprises the steps of oxidizing the surface of a semiconductor body to produce a substantially thick oxide film over the surface, said body containing impurities which will impart an N or a P-type conductivity, exposing a first island of unoxidized surface over said body by removing a portion of said film by photoengraving, forming a first region of different conductivity to that of said semiconductor body by diffusing into said island a first diffusant which will produce said different conductivity and to which said film is impervious and diffusing said diffusant into said body in a minimum oxidizing atmosphere so as to form a PN junction with said semiconductor body extending to the surface beneath said thick oxide layer and to regrow an oxide layer substantially thinner than the original film, etching said surface lightly to remove only the thin oxide layer covering the first island and thereby expose said island and forming a second region of opposite conductivity to that of said first region and contained therewithin by depositing onto said first island a second diffusant which will produce said opposite conductivity and to which said film is impervious and diffusing said diffusant into said first region in a minimum oxdized atmosphere whereby said island surface is reoxidized to a thickness substantially thinner than the original film, exposing a second island of unoxidized surface by cutting a hole in said oxide film by photoengraving, said hole being at least substantially equal in area to that of said island and being laterally displaced from but overlapping said first island, growing a lateral extension to said first region by depositing on said second island a third diffusant which has impurities of the type forming said first region but to which said film is impervious and diffusing said diffusant in a minimum oxidizing atmosphere into said body, said third diffusant having a concentraton of impurities less than said second region but greater than that of said body so that the conductivity of the second island area is changed to that of said first region except that portion comprising said second region, removing the thin layers of oxide film regrown over both said islands by lightly etching so as to remove the thin layers of oxide but leave the original thicker surface oxide film, and plating separate first and second metal strips onto said body, said first metal strip covering an area to include a portion of said second region exposed by the preceding step but not including any portion of said second island, thereby forming an ohmic electrical connection with said second region but overlying oxide film elsewhere, said second metal strip overlying said body to be substantially in line with but extending outwardly in an opposite direction from said first strip to include the exposed surface of said first region to which an ohmic electrical connection is formed and thereby overlying oxide film at all points except where in ohmic contact with said first region.

5. A method of fabricating semiconductor devices which comprises the steps of oxidizing the surface of a semiconductor body to produce a substantially thick oxide film over the surface, exposing islands of unoxidized surface over said body by removing portions of said film by photoengraving, forming a first region of different conductivity to that of said semiconductor by depositing on said island a first diffusant which will produce said different conductivity and to which said film is substantially impervious and diffusing said diffusant into said body in an oxidizing atmosphere so as to regrow an oxide layer over said island, exposing a first hole in the regrown oxide film overlying said island by photoengraving a small area located eccentrically within said island at one extreme end thereof, forming a second region of opposite conductivity to that of said first region and contained therewithin by depositing into said first hole a second diffusant to which said film is substantially impervious which will produce said opposite conductivity and diffusing said diffusant into said first region in a minimum oxidizing atmosphere whereby the area over said first hole is reoxidized to a thickness substantially thinner than the original film, exposing a second hole within the film overlying said island by photoengraving a small area located eccentrically within said island at the opposite end from said first hole, re-exposing the surface of said first hole by etching the surface lightly so as to remove the thin oxide layer overlying the first hole but retaining the thicker original oxide film, and plating separate first and second metal strips onto said body, said first metal strip covering an area to include said first hole but not the second hole, thereby forming an ohmic electrical connection through said first hole to said second region but overlying oxide film elsewhere, said second metal strip overlying said body substantially in line with but extending outwardly in the opposite direction from said first strip to include the area of said second hole exposing said first region to which an ohmic electrical connection is formed and thereby overlying oxide film at all points except where in ohmic contact with said first region.

References Cited by the Examiner

UNITED STATES PATENTS 2,639,071 5/53 Hall -------------- 53—258 XR

FOREIGN PATENTS 353,640 7/31 Great Britain.
397,791 8/33 Great Britain.

RICHARD H. EANES, Jr., *Primary Examiner.*